(12) United States Patent
Okada et al.

(10) Patent No.: US 9,370,111 B2
(45) Date of Patent: Jun. 14, 2016

(54) CERAMIC MULTILAYER SUBSTRATE AND METHOD FOR PRODUCING THE SAME

(71) Applicant: Murata Manufacturing Co., Ltd., Nagaokakyo-shi, Kyoto-fu (JP)

(72) Inventors: Yoshiko Okada, Yasu (JP); Osamu Chikagawa, Yasu (JP); Hidekiyo Takaoka, Omihachiman (JP); Shodo Takei, Nagaokakyo (JP)

(73) Assignee: Murata Manufacturing Co., Ltd., Kyoto (JM)

( * ) Notice: Subject to any disclaimer, the term of this patent is extended or adjusted under 35 U.S.C. 154(b) by 36 days.

(21) Appl. No.: 14/320,765

(22) Filed: Jul. 1, 2014

(65) Prior Publication Data

US 2014/0312539 A1  Oct. 23, 2014

Related U.S. Application Data

(60) Division of application No. 12/720,745, filed on Mar. 10, 2010, now Pat. No. 8,802,998, which is a continuation of application No. PCT/JP2008/065217, filed on Aug. 26, 2008.

(30) Foreign Application Priority Data

Sep. 10, 2007  (JP) ................................. 2007-234771

(51) Int. Cl.

| | |
|---|---|
| *H01G 2/02* | (2006.01) |
| *H05K 3/46* | (2006.01) |
| *H01G 4/30* | (2006.01) |
| *H05K 1/18* | (2006.01) |
| *H01G 4/005* | (2006.01) |
| *H05K 1/03* | (2006.01) |
| *H05K 1/09* | (2006.01) |

(52) U.S. Cl.
CPC ............. *H05K 3/4629* (2013.01); *H01G 2/02* (2013.01); *H01G 4/30* (2013.01); *H05K 1/186* (2013.01); *H05K 3/4611* (2013.01); *H01G 4/005* (2013.01); *H01L 2224/82039* (2013.01); *H01L 2224/82047* (2013.01); *H01L 2924/01004* (2013.01); *H01L 2924/01025* (2013.01); *H01L 2924/01046* (2013.01); *H01L 2924/01078* (2013.01); *H01L 2924/01079* (2013.01); *H01L 2924/09701* (2013.01); *H05K 1/0306* (2013.01); *H05K 1/092* (2013.01); *H05K 2201/10636* (2013.01); *Y02P 70/611* (2015.11); *Y10T 29/49155* (2015.01)

(58) Field of Classification Search
None
See application file for complete search history.

(56) References Cited

U.S. PATENT DOCUMENTS 6,396,680 B1 *  5/2002  Nishiyama ........... H01G 4/1245
                                                    361/311

OTHER PUBLICATIONS

Okada et al.; "Ceramic Multilayer Substrate and Method for Producing the Same"; U.S. Appl. No. 12/720,745, filed Mar. 10, 2010.

*Primary Examiner* — Dion R Ferguson
(74) *Attorney, Agent, or Firm* — Keating & Bennett, LLP (57) ABSTRACT

A ceramic multilayer substrate incorporating a chip-type ceramic component, in which, even if the chip-type ceramic component is mounted on the surface of the ceramic multilayer substrate, bonding strength between the chip-type ceramic component and an internal conductor or a surface electrode of the ceramic multilayer substrate is greatly improved and increased. The ceramic multilayer substrate includes a ceramic laminate in which a plurality of ceramic layers are stacked, an internal conductor disposed in the ceramic laminate, a surface electrode disposed on the upper surface of the ceramic laminate, and a chip-type ceramic component bonded to the internal conductor or the surface electrode through an external electrode. The internal conductor or the surface electrode is bonded to the external electrode through a connecting electrode, and the connecting electrode forms a solid solution with any of the internal conductor, the surface electrode, and the external electrode.

4 Claims, 3 Drawing Sheets

CERAMIC MULTILAYER SUBSTRATE AND METHOD FOR PRODUCING THE SAME

BACKGROUND OF THE INVENTION

1. Field of the Invention

The present invention relates to a ceramic multilayer substrate incorporating a chip-type ceramic component and a method for producing the same. More particularly, the present invention relates to a ceramic multilayer substrate and a method for producing the same in which connectivity between a chip-type ceramic component and a wiring conductor can be enhanced.

2. Description of the Related Art

As this type of technique, there is conventionally known a multilayer ceramic substrate incorporating an electronic component, which is described in Japanese Unexamined Patent Application Publication No. 63-122295. The multilayer ceramic substrate incorporating an electronic component includes a multilayer ceramic substrate, a chip-type electronic component embedded in a space constituted by a recess or a through-hole within the multilayer ceramic substrate, and a conductor interconnecting the chip-type electronic component provided between the layers or in the space of the multilayer ceramic substrate. In such a multilayer ceramic substrate, a chip-type capacitor is mounted on an internal conductor composed of a conductive paste, and the internal conductor is sintered simultaneously with sintering of the ceramic multilayer substrate to thereby connect the outer electrode of the chip-type capacitor and the internal conductor to each other.

In general, internal conductors of a ceramic multilayer substrate are composed of a metal material, such as Cu or Ag, and external electrodes of a chip-type capacitor are composed of a metal containing Ni as a main constituent in order to reduce cost. An internal conductor includes an in-plane conductor extending along the interface between upper and lower ceramic layers and having a predetermined pattern, and a via conductor electrically connecting upper and lower in-plane conductors. A chip-type capacitor is connected to an in-plane conductor and/or a via conductor serving as an electrode.

However, in the conventional ceramic multilayer substrate, in the case where Cu is used to form internal conductors, Cu is easily oxidized and it is difficult to set conditions for firing. Since the variation of firing atmosphere affects quality, the quality is not stabilized, which is a problem. In contrast, in the case where Ag is used, the problem associated with Cu does not occur. However, since Ag and Ni do not form a solid solution, there is a possibility that, in comparison with the case where Cu is used as a main constituent, internal conductors containing Ag as a main constituent in the ceramic multilayer substrate may not be sufficiently connected to external electrodes of a chip-type ceramic component, such as a chip-type capacitor, containing Ni as a main constituent. If connectivity between an internal patterned electrode and an external electrode is unsatisfactory, cracks and fractures may occur at the junction between the ceramic multilayer substrate and the chip-type ceramic component due to shrinkage stress, drop impact, or the like in the process of sintering of the ceramic multilayer substrate. This results in problems, such as degradation in electrical characteristics and mechanical characteristics.

SUMMARY OF THE INVENTION

In order to solve the problems described above, preferred embodiments of the present invention provide a ceramic multilayer substrate incorporating a chip-type ceramic component, in which, even if the chip-type ceramic component is mounted on the surface of the ceramic multilayer substrate, bonding strength between the chip-type ceramic component and an internal conductor or a surface electrode of the ceramic multilayer substrate can be enhanced, and also provide a method for producing the same.

The present inventors have conducted various studies on bondability between an internal conductor, which is a wiring conductor, or a surface electrode of a ceramic multilayer substrate and an external electrode of a chip-type ceramic component, and as a result, have discovered that by interposing a connecting electrode containing a specific metal as a main constituent between an internal conductor and/or a surface electrode and an external electrode, bonding strength between the two is markedly increased.

Preferred embodiments of the present invention have been developed on the basis of the discovery described above.

That is, a ceramic multilayer substrate according to a preferred embodiment of the present invention includes a ceramic laminate in which a plurality of ceramic layers are stacked, an internal conductor disposed in the ceramic laminate, a surface electrode disposed on a principal surface of the ceramic laminate, and a chip-type ceramic component bonded to the internal conductor or the surface electrode through a terminal electrode, in which the internal conductor or the surface electrode is bonded to the terminal electrode through a connecting electrode, and the connecting electrode forms a solid solution with any of the internal conductor or the surface electrode and the terminal electrode.

Furthermore, in the ceramic multilayer substrate according to a preferred embodiment of the present invention, preferably, the connecting electrode forms solid solutions at boundaries with the internal conductor, the surface electrode, and the terminal electrode.

Furthermore, in the ceramic multilayer substrate according to a preferred embodiment of the present invention, preferably, the chip-type ceramic component is disposed within the ceramic laminate.

Furthermore, in the ceramic multilayer substrate of the present invention, preferably, the connecting electrode is interposed at a junction of the internal conductor or the surface electrode and the terminal electrode.

Furthermore, in the ceramic multilayer substrate according to a preferred embodiment of the present invention, preferably, the internal conductor and the surface electrode each include a metal containing Ag as a main constituent, the terminal electrode is composed of a metal containing Ni as a main constituent, and the connecting electrode is composed of a mixed material including a metal material, which forms a solid solution with each of Ag and Ni, and Ag.

Furthermore, in the ceramic multilayer substrate according to a preferred embodiment of the present invention, preferably, the metal material is preferably at least one metal selected from Au, Cu, Ge, Mn, Pd, Zn, Sn, and Pt, for example.

Furthermore, in the ceramic multilayer substrate according to a preferred embodiment of the present invention, preferably, the mixed material contains boron.

Furthermore, a method for producing a ceramic multilayer substrate according to a preferred embodiment of the present invention includes a step of forming a ceramic green sheet having an internal conductor portion; a step of arranging a chip-type ceramic component, which includes, as a base body, a sintered ceramic body including an internal electrode, on a surface of the ceramic green sheet such that a connecting electrode portion is interposed between a terminal electrode of the chip-type ceramic component and the internal conductor portion; a step of forming a green sheet laminate by stacking the ceramic green sheet having the chip-type ceramic component arranged thereon together with another ceramic green sheet having an internal conductor portion, the green sheet laminate incorporating the chip-type ceramic component; and a step of firing the green sheet laminate.

Furthermore, in the method for producing a ceramic multilayer substrate according to a preferred embodiment of the present invention, preferably, a conductive paste containing Ag as a main constituent is used for the internal conductor portion and the surface electrode portion; a conductive paste containing Ni as a main constituent is used for the terminal electrode; and a conductive paste composed of a mixed material containing a metal material, which forms a solid solution with each of Ag and Ni, and Ag is preferably used for the connecting electrode portion, for example.

Furthermore, in the method for producing a ceramic multilayer substrate according to a preferred embodiment of the present invention, preferably, in the terminal electrode, Ni is arranged in the surface layer side and Cu is arranged in the chip-type ceramic component side.

Furthermore, in the method for producing a ceramic multilayer substrate according to a preferred embodiment of the present invention, preferably, as the metal material, at least one metal selected from Au, Cu, Ge, Mn, Pd, Zn, Sn, and Pt is preferably used, for example.

Furthermore, in the method for producing a ceramic multilayer substrate according to a preferred embodiment of the present invention, preferably, as the metal material, Ge resinate or Mn resinate is preferably used, for example.

Furthermore, in the method for producing a ceramic multilayer substrate according to a preferred embodiment of the present invention, preferably, the mixed material preferably contains boron.

Furthermore, preferably, the method for producing a ceramic multilayer substrate according to a preferred embodiment of the present invention further includes a step of providing a constraining layer on an outermost surface layer or an inner layer of the green sheet laminate, the constraining layer containing, as a main constituent, a ceramic material that is not substantially sintered at the sintering temperature of the ceramic green sheet.

According to a preferred embodiment of the present invention, it is possible to provide a ceramic multilayer substrate incorporating a chip-type ceramic component, in which, even if the chip-type ceramic component is mounted on the surface of the ceramic multilayer substrate, bonding strength between the chip-type ceramic component and an internal conductor or a surface electrode of the ceramic multilayer substrate can be enhanced, and to provide a method for producing the same.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
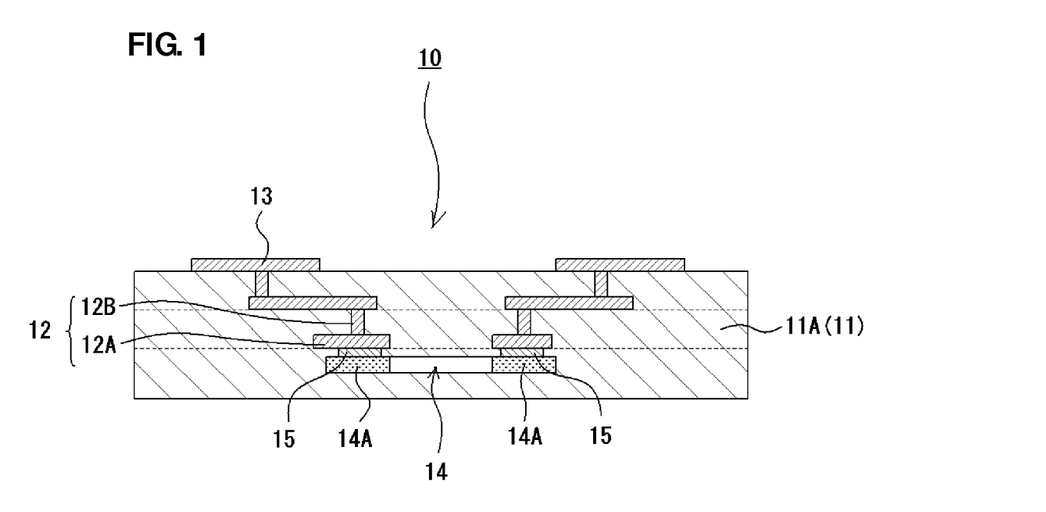
FIG. 1 is a cross-sectional view showing a substantial portion of a ceramic multilayer substrate according to a preferred embodiment of the present invention.
Figure 2A:
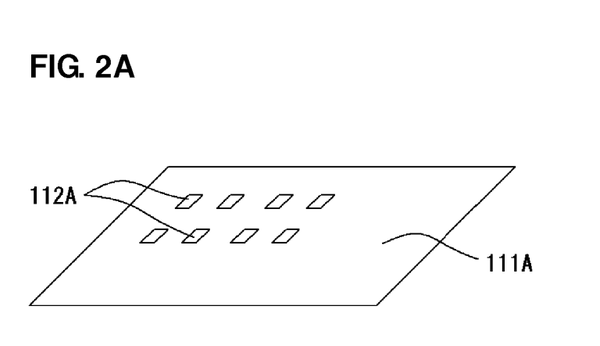
FIGS. 2A to 2C each show a substantial portion of a step in a method for producing a ceramic multilayer substrate according to a preferred embodiment of the present invention.
Figure 2B:
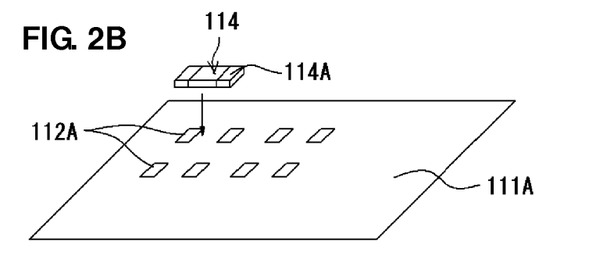
Figure 3:
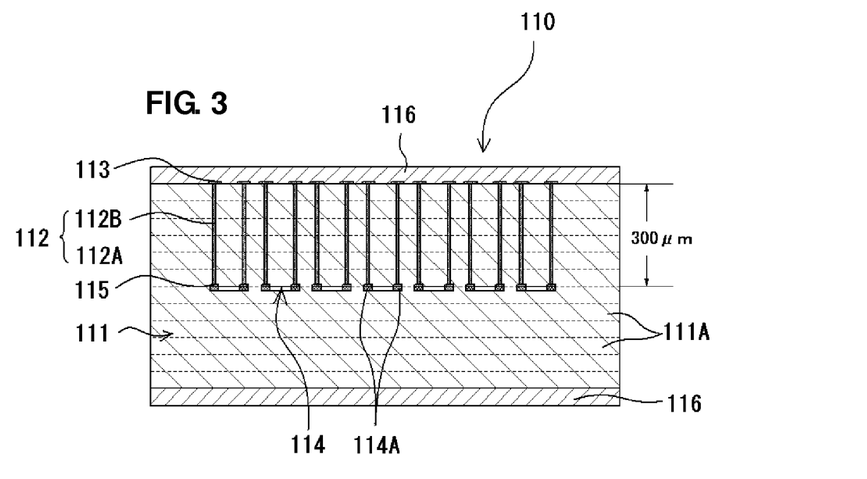
FIG. 3 is a cross-sectional view showing a ceramic multilayer substrate in a step in a method for manufacturing a ceramic multilayer substrate according to a preferred embodiment of the present invention.
Figure 4:
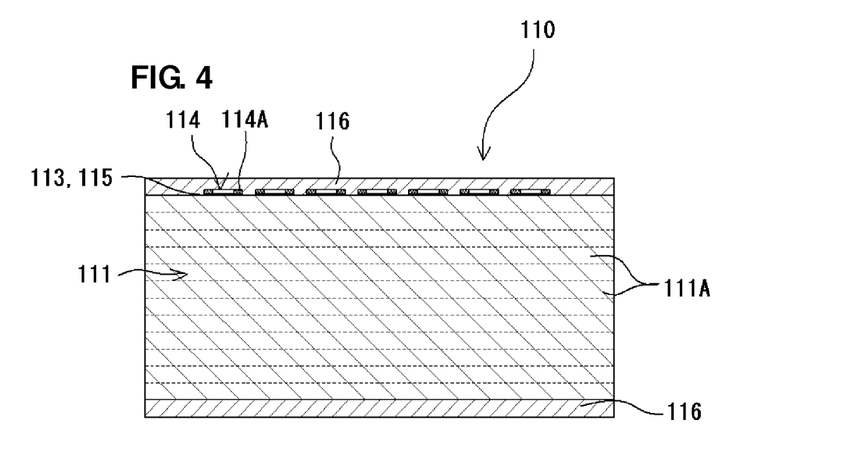
FIG. 4 is a cross-sectional view showing a ceramic multilayer substrate in a step in a method for manufacturing a ceramic multilayer substrate according to a preferred embodiment of the present invention.

The present invention will be described below on the basis of preferred embodiments shown in FIGS. 1 to 4. FIG. 1 is a cross-sectional view showing a substantial portion of a ceramic multilayer substrate according to a preferred embodiment of the present invention, and FIGS. 2A to 2C each show a substantial portion of a step in a method for producing a ceramic multilayer substrate according to a preferred embodiment of the present invention. FIGS. 3 and 4 are each a cross-sectional view showing a ceramic multilayer substrate in a step in a method for manufacturing a ceramic multilayer substrate according to a preferred embodiment of the present invention.

A ceramic multilayer substrate 10 according to this preferred embodiment includes, for example, as shown in FIG. 1, a ceramic laminate 11 in which a plurality of ceramic layers 11A are stacked, an internal conductor 12 provided in the ceramic laminate 11, a surface electrode 13 provided on a principal surface (upper surface) of the ceramic laminate 11, and a chip-type ceramic component 14 disposed at the interface between upper and lower ceramic layers 11A, the chip-type ceramic component 14 being incorporated in the ceramic laminate 11.

As shown in FIG. 1, the internal conductor 12 includes an in-plane conductor 12A extending along the interface between upper and lower ceramic layers 11A and having a predetermined pattern, and a via conductor 12B extending through a ceramic layer 11A in a predetermined pattern so as to electrically connect upper and lower in-plane conductors 12A to each other or to electrically connect an in-plane conductor 12A and the surface electrode 13 to each other.

The chip-type ceramic component 14 includes, for example, a plurality of ceramic layers, a plurality of upper and lower internal electrodes disposed along the interface between the upper and lower ceramic layers, and a pair of terminal electrodes (hereinafter, may also be referred to as "external electrodes") 14A disposed on the right and left sides and electrically connected to the internal electrodes, and defines a chip-type capacitor. In the chip-type capacitor 14, the external electrodes 14A are each connected to an in-plane conductor 12A through a connecting electrode 15. As will be described later, the connecting electrode 15 includes a metal material which forms solid solutions with both of the external electrode 14A and the in-plane conductor 12A, thus enhancing the bonding strength between the external electrodes 14A and the in-plane conductors 12A.

The internal conductor 12 and the surface electrode 13 of the ceramic multilayer substrate 10 each preferably include, for example, a metal material containing Ag as a main constituent (an Ag alloy, such as an Ag—Cu alloy or an Ag—Pd alloy). The external electrode 14A of the chip-type ceramic component 14 includes, for example, a metal material containing Ni as a main constituent (a Ni alloy). Since Ag and Ni do not form a solid solution, as described above, in this state, it is not possible to strongly connect the chip-type ceramic component 14 to the internal conductor 12. Therefore, in this preferred embodiment, a connecting electrode 15 obtained by sintering a mixed material simultaneously with the ceramic layers 11A is interposed, the mixed material including a metal material, which forms solid solutions with both of the metal containing Ag as a main constituent of the in-plane conductor 12A and the metal containing Ni as a main constituent of the external electrode 14A.

The connecting electrode 15 includes Ag as a main constituent and a metal material M which forms solid solutions with both of Ag and Ni as an accessory constituent. The metal material M is a metal component that improves connectivity between the internal conductor 12 and the external electrode 14A. As such a metal material M, for example, at least one metal selected from Au, Cu, Ge, Mn, Pd, Zn, Sn, and Pt is preferably used, for example. These metals may be used alone or in appropriate combination of two or more. Since the connecting electrode 15 contains such a metal material M, solid solutions are formed with both Ag of the internal conductor 12 and Ni of the external electrode 14A, thus making it possible to strongly connect the internal conductor 12 and the outer electrode 14A to each other. Furthermore, the mixed material constituting the connecting electrode 15 contains boron. Consequently, even in the case where the ceramic multilayer substrate 10 is fired in air, by reducing NiO, oxidation of Ni can be suppressed or prevented.

In order to enhance the bonding strength between the internal conductor 12 having Ag as a main constituent and the external electrode 14A having Ni as a main constituent, the contents of the individual metals used for the connecting electrode 15 are preferably as follows: Ag in a range of about 72% to about 76% by weight, and M in a range of about 0.8% to about 4% by weight, for example.

Furthermore, since the connecting electrode 15 is used only for junctions between the in-plane conductor 12A or the via conductor 12B of the internal conductor 12, the amount of the metal material used in the connecting electrode 15 is extremely small. Thus, there is substantially no influence of the difference in shrinkage from the ceramic layers 11A, diffusion of metal particles, or the like in the process of sintering the ceramic laminate 11, and the influence on the performance of the ceramic multilayer substrate 10 is very small and negligible.

Although the material for the ceramic laminate 11 is not particularly limited, a low temperature co-fired ceramic (LTCC) material is preferably used. The low temperature co-fired ceramic material is defined as a ceramic material that can be sintered at a temperature of 1,050° C. or lower and can be co-fired with Ag, Cu, or the like which has low resistivity. Specific examples of the low temperature co-fired ceramic material include a glass composite LTCC material in which borosilicate glass is mixed with ceramic powder composed of alumina, forsterite, or the like; a crystallized glass LTCC material including $ZnO$—$MgO$—$Al_2O_3$—$SiO_2$ crystallized glass; and a non-glass LTCC material including $BaO$—$Al_2O_3$—$SiO_2$ ceramic powder, $Al_2O_3$—$CaO$—$SiO_2$—$MgO$—$B_2O_3$ ceramic powder, or the like. By using the low temperature co-fired ceramic material for the ceramic laminate 11, Ag can be used as the internal conductor 12 and the surface electrode 13, and the ceramic laminate 11 and the internal conductor 12 can be co-fired at a low temperature of 1,050° C. or lower.

The material for the chip-type ceramic component is not particularly limited as long as a dielectric ceramic material is used. For example, the chip-type ceramic component 14 includes, as a base body, a sintered ceramic body composed of a dielectric ceramic material, such as barium titanate, fired at approximately 1,200° C. or higher. As the chip-type ceramic component 14, for example, a chip-type ceramic capacitor may be mentioned. The chip-type ceramic component 14 is not limited to a chip-type ceramic capacitor as long as it is composed of a ceramic material. For example, the chip-type ceramic component 14 may be a chip-type inductor or the like which uses the property of being a magnetic material.

Next, a preferred embodiment of a method for producing a ceramic multilayer substrate will be described with reference to FIG. 2. In this preferred embodiment, the case in which a ceramic multilayer substrate 10 is produced using a zero shrinking process will be described. The zero shrinking process is defined as a process in which the size in the planar direction of a ceramic multilayer substrate does not substantially change before and after firing the ceramic multilayer substrate.

In this preferred embodiment, chip-type ceramic components 114 including, as base bodies, sintered ceramic bodies having a predetermined size are prepared. Then, for example, using a slurry containing a low temperature co-fired ceramic material in which $Al_2O_3$ is used as a filler and borosilicate glass is used as a sintering aid, a predetermined number of ceramic green sheets 111A are formed. The ceramic green sheets 111A are prepared such that the thickness after sintering is, for example, about 50 µm. After via-holes are formed by laser machining or punching, as shown in FIG. 2A, using a conductive paste containing Ag as a conductive component, a plurality of via conductor portions (not shown) for via conductors and in-plane conductor portions 112A are formed. In the similar manner, using a conductive paste, surface electrode portions 113 (refer to FIG. 3) are formed on an uppermost ceramic green sheet 111A.

Meanwhile, a conductive paste containing Ag powder and powder of a metal material M is applied, as connecting electrode portions 115, to portions serving as junctions of external electrodes 114A of the chip-type ceramic components 114 (refer to FIG. 3). Concurrently, as shown in FIG. 2A, an organic spray adhesive is applied onto a specific ceramic green sheet 111A having a plurality of in-plane conductor portions 112A, and then as shown in FIG. 2B, external electrodes 114A on which connecting electrode portions (not shown) serving as connecting electrodes have been disposed in advance are aligned onto the in-plane conductor portions 112A, and the chip-type ceramic components 114 are mounted on the predetermined in-plane conductor portions 112A, and then fixed through the adhesive as shown in FIG. 2C. In this preferred embodiment, the thickness of the connecting electrode portions applied onto the external electrode portions 114A is preferably set to be about 5 µm, for example. As the organic adhesive, synthetic rubber, a mixture in which a synthetic resin and a plasticizer are mixed, or the like may preferably be used.

Figure 2C:
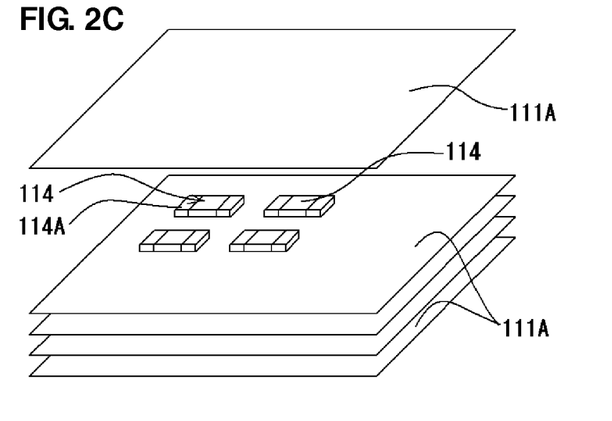

Then, as shown in FIG. 2C, the ceramic green sheets 111A having the in-plane conductor portions 112A and via conductor portions are stacked in a predetermined order such that the ceramic green sheet 111A on which the chip-type ceramic components 114 are mounted is incorporated into a specific location. Then, as shown in FIG. 3, the uppermost ceramic green sheet 111A having the surface electrode portions 113 is stacked to obtain a green sheet laminate 111. Shrinkage suppression layers 116 are disposed on the upper and lower surfaces of the green sheet laminate as shown in FIG. 3. The green sheet laminate 111 preferably is subjected to preliminary pressure bonding, for example, at a pressure of about 20 MPa through the upper and lower shrinkage suppression layers 116, and then the laminate is subjected to primary pressure bonding at about 100 MPa, for example. Thereby, a pressure-bonded body 110 is obtained as shown in the cross-sectional view of FIG. 3. As the shrinkage suppression layers 116, using a slurry containing hardly sinterable powder (for example, ceramic powder, such as $Al_2O_3$, having a high sintering temperature), specifically $Al_2O_3$, as a main constituent and an organic binder as an accessory constituent, sheets are formed as shown in the drawing.

After the pressure-bonded body 110 is obtained, the pressure-bonded body 110 is fired, for example, in the air atmosphere at about 870° C. to obtain a ceramic multilayer substrate 10 according to this preferred embodiment. By performing the firing, the green sheet laminate 111 is sintered, and the ceramic laminate 111 incorporating a plurality of chip-type ceramic components 14 at the same interface is obtained between the upper and lower shrinkage suppression layers 116. During firing, although the green sheet laminate 111 is suppressed from shrinking in the planar direction by the upper and lower shrinkage suppression layers 116, the green sheet laminate 11 shrinks vertically because of viscous flow to make up for the suppression in the planar direction. Furthermore, after firing, the shrinkage suppression layers 116 become porous, unsintered ceramic layers.

The firing temperature is preferably a temperature at which the low temperature co-fired ceramic material is sintered, for example, in a range of preferably about 800° C. to about 1,050° C. If the firing temperature is lower than about 800° C., there is a possibility that ceramic components in the green sheet laminate 111 may not be sufficiently sintered. If the firing temperature exceeds about 1,050° C., there is a possibility that metal particles in the internal conductors 112 may be melted and diffused into the ceramic layers 11A, and also there is a possibility that characteristic values may vary because of interdiffusion between the material constituting the chip-type ceramic components 14 incorporated and the material constituting the ceramic layers 11A.

After firing, the upper and lower shrinkage suppression layers 116, which are porous, are removed by blasting or ultrasonic cleaning. Thereby, a ceramic multilayer substrate 10 with a thickness of about 0.6 mm can be obtained. The external electrodes 14A of the chip-type ceramic components 14 of the ceramic multilayer substrate 10 are connected to the in-plane conductors 12A in the ceramic laminate 11 through the connecting electrodes 15. Since the connecting electrodes 15 contain a metal material M which forms a solid solution with each of Ag and Ni, the connecting electrodes 15 form solid solutions with the external electrodes 14A of the chip-type ceramic components 14 and the in-plane conductors 12A of the ceramic multilayer substrate 10. Thus, the external electrodes 14A and the in-plane conductors 12A each form solid solutions with the connecting electrodes 15 and are strongly connected to each other.

As described above, according to this preferred embodiment, the method includes a step of forming ceramic green sheets 111A having internal conductor portions 112 including in-plane conductors 112A and via conductors (not shown); a step of forming connecting electrode portions 115 on the external electrodes 114A of the chip-type ceramic components 114, each including, as a base body, a sintered ceramic body having an internal electrode; a step of aligning the connecting electrode portions 115 onto the in-plane conductor portions 112A of the ceramic green sheet 111A and mounting the chip-type ceramic components 114 on the ceramic green sheet 111A; a step of forming a green sheet laminate 110 by stacking the ceramic green sheet 111A having the chip-type ceramic components 114 arranged thereon together with the other ceramic green sheets having internal conductor portions, the green sheet laminate 110 incorporating the chip-type ceramic components 114; and a step of firing the green sheet laminate 110 at a predetermined temperature. Consequently, by firing of the green sheet laminate 110 according to this preferred embodiment, the green sheet laminate 110 is sintered as the ceramic laminate 11, and simultaneously with the sintering, the internal conductor portions 112, the external electrode portions 114A of chip-type ceramic components 114, and the connecting electrode portions 115 interposed therebetween are sintered. Thus, the internal conductors 12 and the external electrodes 14A are connected through the connecting electrodes 15, and the chip-type ceramic components 14 are strongly connected to the in-plane conductors 12A in the ceramic laminate 11. Since the chip-type ceramic components 14 are strongly connected to the in-plane conductors 12 in such a manner, cracks and fractures do not occur at the junctions between the ceramic multilayer substrate 10 and the chip-type ceramic components 14 due to shrinkage stress, drop impact, or the like in the process of sintering of the ceramic multilayer substrate 10. Therefore, it is possible to obtain desired electrical characteristics and mechanical characteristics.

Furthermore, according to this preferred embodiment, the chip-type ceramic components 14 are incorporated in the ceramic laminate 11, which can contribute to a decrease in the height of the ceramic multilayer substrate 10. Furthermore, since the connecting electrodes 15 are interposed between the internal conductors and the junctions of the external electrodes 14A, the amount of the metal material used in the connecting electrodes 15 is extremely small. Thus, there is substantially no influence of the difference in shrinkage from the ceramic layers 11A, diffusion of metal particles, or the like in the process of sintering the ceramic laminate 11, and the influence on the performance of the ceramic multilayer substrate 10 is very small and negligible.

Furthermore, the internal conductors 12 and the surface electrodes 13 are composed of a metal containing Ag as a main constituent, the external electrodes 14A are composed of a metal containing Ni as a main constituent, and the connecting electrodes 15 are composed of a mixed material including a metal material M (at least one metal selected from Au, Cu, Ge, Mn, Pd, Zn, Sn, and Pt), which forms a solid solution with each of Ag and Ni, and Ag. Therefore, the connecting electrodes 15 form solid solutions with Ag of the internal electrodes 12 and Ni of the external electrodes 14A to achieve integration, and the internal electrodes 12 and the external electrodes 14A can be strongly connected to each other. Furthermore, since Ge resinate and/or Mn resinate is used as the metal material M, it is possible to uniformly mix Ge and/or Mn into a conductive paste when the conductive paste is prepared. Furthermore, since the mixed material contains boron, even when the pressure-bonded body 110 is fired in air, Ni of the external electrodes 14A can be prevented from being oxidized, and it is possible to obtain a ceramic multilayer substrate having stable quality. Furthermore, in the chip-type ceramic component 14, a Cu electrode may be disposed between its surface and an external electrode 14A. By disposing the Cu electrode, electrical characteristics of the connecting electrode 15 can be improved.

EXAMPLES

Ceramic multilayer substrates according to a preferred embodiment of the present invention will be described below on the basis of specific examples.

Example 1

In this example, ceramic multilayer substrates were produced according to the procedure shown in FIGS. 2A to 2C and FIG. 3. Connectivity between external electrodes and in-plane conductors was verified in the case where, using a conductive paste containing metal powder as a metal component, chip-type ceramic components were connected to in-plane conductors in ceramic multilayer substrates.

Preparation of Conductive Paste for Connecting Electrode

As metal components, Ag powder having an average particle size of about 0.7 μm, Zn powder having an average particle size of about 1 μm, Cu powder having an average particle size of about 1 μm, Pd powder having an average particle size of about 1 μm, Au powder having an average particle size of about 1 μm, Ge powder having an average particle size of about 1 μm, Mn powder having an average particle size of about 1 μm, Pt powder having an average particle size of about 1 μm, and Sn powder having an average particle size of about 1 μm, for example, were prepared. As organic components, an ETHOCEL resin and terpineol were prepared. These components were weighed so as to satisfy the compositions shown in Tables 1 and 2, and then kneading was performed using a Hoover's muller. Thereby, conductive pastes in Samples 1 to 24 and Comparative Samples 1 and 2 were prepared.

A chip-type ceramic capacitor was prepared as a chip-type ceramic component. The chip-type ceramic capacitor had a size of approximately 1 mm×0.5 mm×0.3 mm, included internal electrodes composed of Ni, was obtained by firing at a temperature of about 1,300° C., and had a capacitance of about 80 nF, for example. The conductive paste for each of the samples shown in Table 1 was applied to external electrodes of the chip-type ceramic capacitor 114, and connecting electrode portions preferably with a thickness of about 5 μm were formed. The external electrode portions were not subjected to plating treatment.

A ceramic multilayer substrate on which the chip-type ceramic capacitor 14 was to be mounted was produced according to the procedure shown in FIGS. 2A to 2C. That is, first, a slurry containing a low temperature co-fired ceramic material (including $Al_2O_3$ as a filler and borosilicate glass as a sintering aid) was applied onto a carrier film, and a plurality of ceramic green sheets were formed so as to have a thickness of about 50 μm after firing. Via-holes (not shown) were formed by laser machining in a ceramic green sheet 111A, and the via-holes were filled with a conductive paste containing Ag powder as a main constituent to form via conductive portions (not shown). By screen-printing the same conductive paste on the ceramic green sheet 111A, in-plane conductor portions 112A were formed in a predetermined pattern.

Next, by applying an organic adhesive, using a spray, onto a predetermined ceramic green sheet 111A, an organic adhesive layer was formed on the in-plane conductor portions 112A. Then, using a mounter, the chip-type ceramic capacitors 114 which had been prepared in advance were mounted on the ceramic green sheet 111A such that the connecting electrode portions (not shown) were opposed to the mounting surface, as shown in FIG. 2B, and connected to and fixed on the in-plane conductor portions 112A.

Then, as shown in FIG. 2C, the ceramic green sheets 111A having in-plane conductors 112A and via conductors were stacked in a predetermined order such that the ceramic green sheet 111A on which the chip-type ceramic capacitors 114 were mounted was incorporated into a specific location. The uppermost ceramic green sheet 111A including the surface electrode portions 114 was stacked to obtain a green sheet laminate 111. Shrinkage suppression layers 116 were disposed on the upper and lower surfaces of the green sheet laminate 111. The green sheet laminate 111 was subjected to preliminary pressure bonding, for example, at a pressure of about 20 MPa through the upper and lower shrinkage suppression layers 116, and then the laminate was subjected to primary pressure bonding at about 100 MPa, for example. Thereby, a pressure-bonded body 110 shown in the cross-sectional view of FIG. 3 was obtained. As the shrinkage suppression layers 116, using a slurry containing hardly sinterable powder (for example, ceramic powder, such as $Al_2O_3$, having a high sintering temperature), specifically $Al_2O_3$, as a main constituent and an organic binder as an accessory constituent, sheets were formed as shown in the drawing.

After the pressure-bonded body 110 was obtained, the pressure-bonded body 110 was fired, for example, in the air atmosphere at about 870° C. to obtain a ceramic multilayer substrate 10 according to this preferred embodiment. By performing the firing, the green sheet laminate 111 was sintered, and the ceramic laminate 11 incorporating a plurality of chip-type ceramic components 14 at the same interface was obtained between the upper and lower shrinkage suppression layers 116. After firing, the shrinkage suppression layers 116 became porous, unsintered ceramic layers. The shrinkage suppression layers 116 were removed, and a ceramic multilayer substrate 10 having a thickness of about 0.6 mm was obtained. As shown in FIG. 3, a plurality of chip-type ceramic capacitors were arranged at a depth of about 300 μm from the upper surface of the ceramic laminate 11.

TABLE 1

|  | Metal component | | Organic vehicle component | |
| --- | --- | --- | --- | --- |
|  | Ag powder ϕ0.7 μm | Zn powder ϕ1 μm | ETHOCEL resin | Terpineol |
| Sample 1 | 75.5 | 0.8 | 14.7 | 8.2 |
| Sample 2 | 73.9 | 2.4 | 14.7 | 8.2 |
| Sample 3 | 72.3 | 4 | 14.7 | 8.2 |
| Comparative Sample 1 | 77.1 | — | 14.7 | 8.2 |
| Comparative Sample 2 | 76.3 | 0.8 | 14.7 | 8.2 |

% by weight

TABLE 2

|  | Metal component | | | | | | | | Organic vehicle component | |
| --- | --- | --- | --- | --- | --- | --- | --- | --- | --- | --- |
|  | Ag powder ϕ0.7 μm | Cu powder ϕ1 μm | Pd powder ϕ1 μm | Au powder ϕ1 μ | Ge powder ϕ1 μm | Mn powder ϕ1 μm | Pt powder ϕ1 μm | Sn powder ϕ1 μm | ETHOCEL resin | Terpineol |
| Sample 4 | 75.5 | 0.8 | — | — | — | — | — | — | 14.7 | 8.2 |
| Sample 5 | 73.9 | 2.4 | — | — | — | — | — | — | 14.7 | 8.2 |
| Sample 6 | 72.3 | 4 | — | — | — | — | — | — | 14.7 | 8.2 |
| Sample 7 | 75.5 | — | 0.8 | — | — | — | — | — | 14.7 | 8.2 |

TABLE 2-continued

| | Metal component | | | | | | | | Organic vehicle component | |
|---|---|---|---|---|---|---|---|---|---|---|
| | Ag powder φ0.7 μm | Cu powder φ1 μm | Pd powder φ1 μm | Au powder φ1 μ | Ge powder φ1 μm | Mn powder φ1 μm | Pt powder φ1 μm | Sn powder φ1 μm | ETHOCEL resin | Terpineol |
| Sample 8 | 73.9 | — | 2.4 | — | — | — | — | — | 14.7 | 8.2 |
| Sample 9 | 72.3 | — | 4 | — | — | — | — | — | 14.7 | 8.2 |
| Sample 10 | 75.5 | — | — | 0.8 | — | — | — | — | 14.7 | 8.2 |
| Sample 11 | 73.9 | — | — | 2.4 | — | — | — | — | 14.7 | 8.2 |
| Sample 12 | 72.3 | — | — | 4 | — | — | — | — | 14.7 | 8.2 |
| Sample 13 | 75.5 | — | — | — | 0.8 | — | — | — | 14.7 | 8.2 |
| Sample 14 | 73.9 | — | — | — | 2.4 | — | — | — | 14.7 | 8.2 |
| Sample 15 | 72.3 | — | — | — | 4 | — | — | — | 14.7 | 8.2 |
| Sample 16 | 75.5 | — | — | — | — | 0.8 | — | — | 14.7 | 8.2 |
| Sample 17 | 73.9 | — | — | — | — | 2.4 | — | — | 14.7 | 8.2 |
| Sample 18 | 72.3 | — | — | — | — | 4 | — | — | 14.7 | 8.2 |
| Sample 19 | 75.5 | — | — | — | — | — | 0.8 | — | 14.7 | 8.2 |
| Sample 20 | 73.9 | — | — | — | — | — | 2.4 | — | 14.7 | 8.2 |
| Sample 21 | 72.3 | — | — | — | — | — | 4 | — | 14.7 | 8.2 |
| Sample 22 | 75.5 | — | — | — | — | — | — | 0.8 | 14.7 | 8.2 |
| Sample 23 | 73.9 | — | — | — | — | — | — | 2.4 | 14.7 | 8.2 |
| Sample 24 | 72.3 | — | — | — | — | — | — | 4 | 14.7 | 8.2 |

Using an LCR meter, the capacitance of the chip-type capacitors 14 incorporated in each of the ceramic multilayer substrates of Samples 1 to 24 and Comparative Samples 1 and 2 was measured at about 1 MHz and about 0.5 V. The average values of the measurement results were calculated, and the results are shown in Table 3.

Furthermore, a thermal shock test was carried out on the ceramic multilayer substrates, and the test results are shown in Table 3. In Table 3, "H/C" indicates the result of the thermal shock test, in which thermal shock was applied, in a vapor phase, 100 cycles, with the temperature being varied from about −40° C. to about +80° C. per cycle. After the thermal shock test, the capacitance of the chip-type ceramic capacitors 14 was measured. The ceramic multilayer substrate having one or more chip-type ceramic capacitors in which a capacitance was not obtained was determined to be defective. In Table 3, non-defective products are indicated by "○", and defective products are indicated by "x".

TABLE 3

| | Capacitance (nF) | H/C | Determination |
|---|---|---|---|
| Sample 1 | 84.7 | ○ | ○ |
| Sample 2 | 85.8 | ○ | ○ |
| Sample 3 | 82.7 | ○ | ○ |
| Sample 4 | 84.3 | ○ | ○ |
| Sample 5 | 82.9 | ○ | ○ |
| Sample 6 | 84.0 | ○ | ○ |
| Sample 7 | 80.3 | ○ | ○ |
| Sample 8 | 83.0 | ○ | ○ |
| Sample 9 | 83.0 | ○ | ○ |
| Sample 10 | 81.8 | ○ | ○ |
| Sample 11 | 80.2 | ○ | ○ |
| Sample 12 | 82.2 | ○ | ○ |
| Sample 13 | 81.3 | ○ | ○ |
| Sample 14 | 78.2 | ○ | ○ |
| Sample 15 | 82.7 | ○ | ○ |
| Sample 16 | 80.5 | ○ | ○ |
| Sample 17 | 78.5 | ○ | ○ |
| Sample 18 | 84.9 | ○ | ○ |
| Sample 19 | 80.0 | ○ | ○ |
| Sample 20 | 85.6 | ○ | ○ |
| Sample 21 | 82.9 | ○ | ○ |
| Sample 22 | 85.4 | ○ | ○ |
| Sample 23 | 81.9 | ○ | ○ |
| Sample 24 | 84.5 | ○ | ○ |
| Comparative Sample 1 | 83.9 | x | x |
| Comparative Sample 2 | 81.4 | ○ | ○ |

According to the results shown in Table 3, in Samples 1 to 24 of this example, each of the chip-type ceramic capacitors has satisfactory thermal shock resistance, connection to the internal conductors (in-plane conductors) of the ceramic multilayer substrates is ensured, and desired capacitances are obtained. In contrast, in Comparative Samples 1 and 2, although desired capacitances are obtained in the chip-type ceramic capacitors in both comparative samples, Comparative Sample 1 does not endure the thermal shock test. Consequently, it has been found that, in the case where chip-type ceramic capacitors are embedded inside at 300 μm from the upper surface of a ceramic multilayer substrate, it is not possible to ensure connection to internal conductors or external electrodes when connecting electrodes contain Ag alone without containing a metal that improves connectivity.

Example 2

In this example, connectivity between external electrodes and in-plane conductors was verified in the case where, using a conductive paste containing a metal resinate as a metal component, chip-type ceramic components were connected to in-plane conductors in ceramic multilayer substrates.

As metal components, Ag powder with an average particle size of about 0.7 μm, Ge resinate (Ge concentration: about 50% by weight), and Mn resinate (Mn concentration: about 50% by weight) were prepared. As organic components, an ETHOCEL resin and terpineol were prepared. These components were weighed so as to satisfy the compositions shown in Table 4, and then kneading was performed using a Hoover's muller. Thereby, Samples 25 to 30 were prepared.

TABLE 4

| | Metal component | | | Organic vehicle component | |
|---|---|---|---|---|---|
| | Ag powder ϕ0.7 μm | Ge resinate Ge concentration: 50% | Mn resinate Mn concentration: 50% | ETHOCEL resin | Terpineol |
| Sample 25 | 74.7 | 1.6 | — | 14.7 | 8.2 |
| Sample 26 | 71.5 | 4.8 | — | 14.7 | 8.2 |
| Sample 27 | 68.3 | 8 | — | 14.7 | 8.2 |
| Sample 28 | 74.7 | — | 1.6 | 14.7 | 8.2 |
| Sample 29 | 71.5 | — | 4.8 | 14.7 | 8.2 |
| Sample 30 | 68.3 | — | 8 | 14.7 | 8.2 |

Using these conductive pastes, ceramic multilayer substrates incorporating chip-type ceramic components were produced according to the same procedure as that in Example 1, and connectivity of the chip-type ceramic capacitors was evaluated. The results thereof are shown in Table 5.

TABLE 5

| | Capacitance (nF) | H/C | Determination |
|---|---|---|---|
| Sample 25 | 84.7 | ○ | ○ |
| Sample 26 | 85.8 | ○ | ○ |
| Sample 27 | 82.7 | ○ | ○ |
| Sample 28 | 84.3 | ○ | ○ |
| Sample 29 | 82.9 | ○ | ○ |
| Sample 30 | 84.0 | ○ | ○ |

According to the results shown in Table 5, as in the ceramic multilayer substrates in Example 1, it has been found that, in Samples 25 to 30, each of the chip-type ceramic capacitors can endure the thermal shock test, satisfactory connectivity can be ensured, and desired capacitances can be ensured.

Example 3

In this example, connectivity between external electrodes and in-plane conductors was verified in the case where, using a conductive paste containing boron in addition to the metal component of Example 1, chip-type ceramic components were connected to in-plane conductors in ceramic multilayer substrates.

As metal components, Ag powder having an average particle size of about 0.7 μm, Zn powder having an average particle size of about 1 μm, Cu powder having an average particle size of about 1 μm, Pd powder having an average particle size of about 1 μm, Au powder having an average particle size of about 1 μm, Pt powder having an average particle size of about 1 μm, Ge powder having an average particle size of about 1 μm, Mn powder having an average particle size of about 1 μm, Sn powder having an average particle size of about 1 μm, Ge resinate (Ge concentration: about 50% by weight), Mn resinate (Mn concentration: about 50% by weight), and B powder having an average particle size of about 1 μm, for example, were prepared. As organic components, an ETHOCEL resin and terpineol were prepared. These components were weighed so as to satisfy the compositions shown in Tables 6 to 8, and then kneading was performed using a Hoover's muller. Thereby, conductive pastes in Samples 31 to 63 and Comparative Samples 1 to 3 were prepared. Here, Comparative Samples 1 and 2 are the same samples as those in Example 1. Comparative Sample 3 was prepared by adding B powder instead of the Zn powder of Comparative Sample 2, in the same amount as that of the Zn powder.

TABLE 6

| | Metal component | | | Organic vehicle component | |
|---|---|---|---|---|---|
| | Ag powder ϕ0.7 μm | Zn powder ϕ1 μm | B powder ϕ1 μm | ETHOCEL resin | Terpineol |
| Sample 31 | 75.5 | 0.8 | 0.8 | 14.7 | 8.2 |
| Sample 32 | 73.9 | 2.4 | 0.8 | 14.7 | 8.2 |
| Sample 33 | 72.3 | 4 | 0.8 | 14.7 | 8.2 |
| Sample 34 | 75.5 | 0.8 | 0.8 | 14.7 | 8.2 |
| Sample 35 | 75.5 | 0.8 | 0.8 | 14.7 | 8.2 |
| Sample 36 | 75.5 | 0.8 | 0.8 | 14.7 | 8.2 |
| Comparative Sample 1 | 77.1 | — | — | 14.7 | 8.2 |
| Comparative Sample 2 | 76.3 | 0.8 | — | 14.7 | 8.2 |
| Comparative Sample 3 | 76.3 | — | 0.8 | 14.7 | 8.2 |

TABLE 7

| | Metal component | | | | | | Organic vehicle component | |
|---|---|---|---|---|---|---|---|---|
| | Ag powder ϕ0.7 μm | Cu powder ϕ1 μm | Pd powder ϕ1 μm | Au powder ϕ1 μm | Pt powder ϕ1 μm | B powder ϕ1 μm | ETHOCEL resin | Terpineol |
| Sample 37 | 75.5 | 0.8 | — | — | — | 0.8 | 14.7 | 8.2 |
| Sample 38 | 73.9 | 2.4 | — | — | — | 0.8 | 14.7 | 8.2 |
| Sample 39 | 72.3 | 4 | — | — | — | 0.8 | 14.7 | 8.2 |
| Sample 40 | 75.5 | — | 0.8 | — | — | 0.8 | 14.7 | 8.2 |
| Sample 41 | 73.9 | — | 2.4 | — | — | 0.8 | 14.7 | 8.2 |
| Sample 42 | 72.3 | — | 4 | — | — | 0.8 | 14.7 | 8.2 |
| Sample 43 | 75.5 | — | — | 0.8 | — | 0.8 | 14.7 | 8.2 |
| Sample 44 | 73.9 | — | — | 2.4 | — | 0.8 | 14.7 | 8.2 |
| Sample 45 | 72.3 | — | — | 4 | — | 0.8 | 14.7 | 8.2 |
| Sample 46 | 75.5 | — | — | — | 0.8 | 0.8 | 14.7 | 8.2 |
| Sample 47 | 73.9 | — | — | — | 2.4 | 0.8 | 14.7 | 8.2 |
| Sample 48 | 72.3 | — | — | — | 4 | 0.8 | 14.7 | 8.2 |

TABLE 8

| | Metal component | | | | | | | Organic vehicle component | |
|---|---|---|---|---|---|---|---|---|---|
| | Ag powder φ0.7 μm | Ge powder φ1 μm | Mn powder φ1 μm | Sn powder φ1 μm | Ge resinate Ge concentration: 50% | Mn resinate Mn concentration: 50% | B powder φ1 μm | ETHOCEL resin | Terpineol |
| Sample 49 | 75.5 | 0.8 | — | — | — | — | 0.8 | 14.7 | 8.2 |
| Sample 50 | 73.9 | 2.4 | — | — | — | — | 0.8 | 14.7 | 8.2 |
| Sample 51 | 72.3 | 4 | — | — | — | — | 0.8 | 14.7 | 8.2 |
| Sample 52 | 75.5 | — | 0.8 | — | — | — | 0.8 | 14.7 | 8.2 |
| Sample 53 | 73.9 | — | 2.4 | — | — | — | 0.8 | 14.7 | 8.2 |
| Sample 54 | 72.3 | — | 4 | — | — | — | 0.8 | 14.7 | 8.2 |
| Sample 55 | 75.5 | — | — | 0.8 | — | — | 0.8 | 14.7 | 8.2 |
| Sample 56 | 73.9 | — | — | 2.4 | — | — | 0.8 | 14.7 | 8.2 |
| Sample 57 | 72.3 | — | — | 4 | — | — | 0.8 | 14.7 | 8.2 |
| Sample 58 | 75.5 | — | — | — | 1.6 | — | 0.8 | 14.7 | 8.2 |
| Sample 59 | 73.9 | — | — | — | 4.8 | — | 0.8 | 14.7 | 8.2 |
| Sample 60 | 72.3 | — | — | — | 8 | — | 0.8 | 14.7 | 8.2 |
| Sample 61 | 75.5 | — | — | — | — | 1.6 | 0.8 | 14.7 | 8.2 |
| Sample 62 | 73.9 | — | — | — | — | 4.8 | 0.8 | 14.7 | 8.2 |
| Sample 63 | 72.3 | — | — | — | — | 8 | 0.8 | 14.7 | 8.2 |

In this example, ceramic multilayer substrates were produced according to the same procedure as that of Example 1 except that, using the conductive pastes of Samples 31 to 63, chip-type ceramic capacitors 114 were mounted on the uppermost layer of the green sheet laminate 111, and ceramic green sheets not provided with internal conductor portions were stacked inside the laminate. Evaluation was performed as in Example 1, and the results thereof are shown in Table 9. Furthermore, in this example, using the conductive pastes of Samples 31 to 63 prepared in Examples 1 and 2, chip-type ceramic capacitors were mounted on the upper surface of the ceramic laminate as shown in FIG. 4, and with respect to the ceramic multilayer substrates, the same evaluation was performed, and the results thereof are shown in Table 9.

TABLE 9

| | Capacitance (nF) | H/C | Determination |
|---|---|---|---|
| Sample 31 | 80.9 | ○ | ○ |
| Sample 32 | 82.0 | ○ | ○ |
| Sample 33 | 79.5 | ○ | ○ |
| Sample 34 | 79.0 | ○ | ○ |
| Sample 35 | 77.5 | ○ | ○ |
| Sample 36 | 78.0 | ○ | ○ |
| Sample 37 | 80.1 | ○ | ○ |
| Sample 38 | 77.4 | ○ | ○ |
| Sample 39 | 86.3 | ○ | ○ |
| Sample 40 | 81.7 | ○ | ○ |
| Sample 41 | 78.1 | ○ | ○ |
| Sample 42 | 79.6 | ○ | ○ |
| Sample 43 | 80.5 | ○ | ○ |
| Sample 44 | 78.7 | ○ | ○ |
| Sample 45 | 78.4 | ○ | ○ |
| Sample 46 | 80.9 | ○ | ○ |
| Sample 47 | 79.6 | ○ | ○ |
| Sample 48 | 80.2 | ○ | ○ |
| Sample 49 | 78.4 | ○ | ○ |
| Sample 50 | 77.2 | ○ | ○ |
| Sample 51 | 79.4 | ○ | ○ |
| Sample 52 | 80.7 | ○ | ○ |
| Sample 53 | 80.0 | ○ | ○ |
| Sample 54 | 76.9 | ○ | ○ |
| Sample 55 | 80.1 | ○ | ○ |
| Sample 56 | 81.8 | ○ | ○ |
| Sample 57 | 80.4 | ○ | ○ |
| Sample 58 | 82.3 | ○ | ○ |
| Sample 59 | 78.6 | ○ | ○ |
| Sample 60 | 79.0 | ○ | ○ |
| Sample 61 | 81.7 | ○ | ○ |
| Sample 62 | 81.4 | ○ | ○ |
| Sample 63 | 78.5 | ○ | ○ |
| Comparative Sample 1 | x | x | x |
| Comparative Sample 2 | x | x | x |
| Comparative Sample 3 | 80.3 | x | x |

According to the results shown in Table 9, in Samples 31 to 63 of this example, each of the chip-type ceramic capacitors can endure the thermal shock test, connection to the surface electrodes of the ceramic multilayer substrates is ensured, and desired capacitances are obtained. In contrast, in Comparative Samples 1 and 2, although desired capacitances are obtained in the chip-type ceramic capacitors in both comparative samples in Example 1, desired capacitances are not obtained in this example. From this, it has been found that since the oxygen concentration decreases in the ceramic multilayer substrate, oxidation of Ni is suppressed, and connection to Ag of in-plane conductors is easily achieved. Furthermore, in Comparative Sample 3, although desired capacitances are obtained in the chip-type ceramic capacitors, the ceramic multilayer substrate does not endure the thermal shock test. From this, it has been found that B contained in Comparative Sample 3 alone is insufficient for ensuring connection to Ni and Ag.

Consequently, in the case where chip-type ceramic capacitors are embedded in the ceramic multilayer substrate, since the oxygen concentration decreases, as is evident from the results of Example 1, as in Comparative Sample 2, oxidation of Ni is suppressed, and connection to Ag is achieved. However, Comparative Samples 1 and 3, which do not contain a metal that improves connectivity, do not endure the thermal shock test. Furthermore, as is evident from the results of Comparative Sample 3, when chip-type ceramic capacitors are mounted on the upper surface of the ceramic multilayer substrate, since the oxygen partial pressure increases, it is necessary to suppress oxidation of Ni by adding B. However, since Comparative Sample 3 contains B alone and does not contain a metal that improves connectivity, interdiffusion between Ag and Ni does not occur, and Comparative Sample 3 does not endure the thermal shock test.

It is to be understood that the present invention is not limited to the preferred embodiments described above, and within the scope not deviating from the spirit of the present invention, various alterations can be made. For example, a ceramic multilayer substrate may include a plurality of chip-type ceramic components and may include both chip-type ceramic components incorporated in a ceramic laminate and chip-type ceramic components mounted on the principal surface of the ceramic laminate. In such a case, internal conductors and terminal electrodes may form solid solutions with connecting electrodes, and surface electrodes and terminal electrodes may form solid solutions with connecting electrodes.

Preferred embodiments of the present invention can be suitably applied to ceramic multilayer substrates which are used in electronic devices, such as mobile communication devices, and methods for producing the same.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for producing a ceramic multilayer substrate comprising:
   a step of forming a ceramic green sheet including an internal conductor portion;
   a step of arranging a chip-type ceramic component, which includes, as a base body, a sintered ceramic body having an internal electrode, on a surface of the ceramic green sheet such that a connecting electrode portion is interposed between a terminal electrode of the chip-type ceramic component and the internal conductor portion;
   a step of forming a green sheet laminate by stacking the ceramic green sheet having the chip-type ceramic component arranged thereon together with another ceramic green sheet having an internal conductor portion, the green sheet laminate incorporating the chip-type ceramic component; and
   a step of firing the green sheet laminate; wherein
   a conductive paste containing Ag as a main constituent is used as the internal conductor portion and the surface electrode portion, a conductive paste containing Ni as a main constituent is used as the terminal electrode, and a conductive paste composed of a mixed material including a metal material, which forms a solid solution with each of Ag and Ni, and Ag is used as the connecting electrode portion, and
   as the metal material, Ge resinate or Mn resinate is used.

2. The method for producing a ceramic multilayer substrate according to claim 1, wherein, in the terminal electrode, Ni is arranged in the surface layer side and Cu is arranged in the chip-type ceramic component side.

3. The method for producing a ceramic multilayer substrate according to claim 1, wherein the mixed material contains boron.

4. The method for producing a ceramic multilayer substrate according to claim 1, further comprising a step of providing a constraining layer on an outermost surface layer or an inner layer of the green sheet laminate, the constraining layer containing, as a main constituent, a ceramic material that is not substantially sintered at the sintering temperature of the ceramic green sheet.

* * * * *